(12) United States Patent
Huang et al.

(10) Patent No.: US 9,525,133 B2
(45) Date of Patent: Dec. 20, 2016

(54) RESISTIVE RANDOM ACCESS MEMORY WITH HIGH UNIFORMITY AND LOW POWER CONSUMPTION AND METHOD FOR FABRICATING THE SAME

(71) Applicant: PEKING UNIVERSITY, Beijing (CN)

(72) Inventors: Ru Huang, Beijing (CN); Muxi Yu, Beijing (CN); Yimao Cai, Beijing (CN); Zhenxing Zhang, Beijing (CN); Qiang Li, Beijing (CN); Ming Li, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 0 days.

(21) Appl. No.: 14/916,950

(22) PCT Filed: Mar. 31, 2014

(86) PCT No.: PCT/CN2014/074369
§ 371 (c)(1),
(2) Date: Mar. 4, 2016

(87) PCT Pub. No.: WO2015/078120
PCT Pub. Date: Jun. 4, 2015

(65) Prior Publication Data
US 2016/0225987 A1    Aug. 4, 2016

(30) Foreign Application Priority Data

Nov. 28, 2013  (CN) .......................... 2013 1 0618361

(51) Int. Cl.
*H01L 29/00* (2006.01)
*H01L 47/00* (2006.01)
(Continued)

(52) U.S. Cl.
CPC ............. *H01L 45/146* (2013.01); *H01L 45/08* (2013.01); *H01L 45/1233* (2013.01);
(Continued)

(58) Field of Classification Search
CPC ...... H01L 45/14; H01L 45/145; H01L 45/146; H01L 45/1608; H01L 45/1616; H01L 45/1625; H01L 45/1641; G11C 2213/32
See application file for complete search history.

(56) References Cited

U.S. PATENT DOCUMENTS 8,405,076 B2    3/2013  Ninomiya et al.
9,184,381 B2 *  11/2015 Mikawa ................ H01L 27/101
(Continued)

FOREIGN PATENT DOCUMENTS

CN    101621114 A    1/2010
CN    101960595 A    1/2011
(Continued)

OTHER PUBLICATIONS

International Search Report of PCT/CN2014/074369 mailed on Aug. 27, 2014.
(Continued)

*Primary Examiner* — Hsien Ming Lee
(74) *Attorney, Agent, or Firm* — Typha IP LLC

(57) ABSTRACT

Disclosed is a resistive random access memory, comprising a substrate, an insulating layer, a bottom electrode, a resistive material film, and a top electrode in an order from bottom to top, wherein the resistive material film is a four-layer structure composed of a same metal oxide; and the four layers in the four-layer structure from bottom to top have resistance values which are increased one after another by more than 10 times, oxygen concentrations which are increased one after another and thickness which are decreased one after another. The present invention may achieve complete formation-rupture of oxygen vacancy conductive filaments (CF) in each layer by dividing the resistive material film of the same metal oxide into four layers according to the different oxygen concentrations, so as to
(Continued)

control accurately the resistance values, so that 2-bit storage with high uniformity is achieved.

10 Claims, 5 Drawing Sheets

(51) Int. Cl.
    *H01L 21/336* (2006.01)
    *H01L 45/00* (2006.01)

(52) U.S. Cl.
    CPC ...... *H01L 45/1616* (2013.01); *H01L 45/1625* (2013.01); *H01L 45/1675* (2013.01)

(56) References Cited

U.S. PATENT DOCUMENTS

| | | | |
|---|---|---|---|
| 2011/0001109 A1 | 1/2011 | Ninomiya et al. | |
| 2012/0178210 A1* | 7/2012 | Lee | H01L 45/04 438/104 |
| 2013/0119344 A1 | 5/2013 | Mikawa et al. | |
| 2013/0207065 A1 | 8/2013 | Chiang | |
| 2013/0221315 A1* | 8/2013 | Wang | H01L 45/08 257/4 |
| 2014/0050013 A1 | 2/2014 | Wei et al. | |
| 2014/0110659 A1* | 4/2014 | Murase | H01L 45/08 257/4 |

FOREIGN PATENT DOCUMENTS

| | | |
|---|---|---|
| CN | 102194995 A | 9/2011 |
| CN | 202308073 U | 7/2012 |
| CN | 101960595 B | 11/2012 |
| CN | 103348472 A | 10/2013 |
| CN | 103606625 A | 2/2014 |
| EP | 2626902 A1 | 8/2013 |
| JP | 4592828 B2 | 12/2010 |
| JP | 5241962 B2 | 7/2013 |
| JP | 5395314 B2 | 1/2014 |
| WO | 2010090002 A1 | 8/2010 |
| WO | 2012046454 A1 | 4/2012 |
| WO | 2013080452 A1 | 6/2013 |

OTHER PUBLICATIONS

Office Action dated Aug. 5, 2015 issued by Chinese State Intellectual Property Office regarding corresponding Chinese Patent Application CN2013106183618.

* cited by examiner

RESISTIVE RANDOM ACCESS MEMORY WITH HIGH UNIFORMITY AND LOW POWER CONSUMPTION AND METHOD FOR FABRICATING THE SAME

CROSS REFERENCE TO RELATED APPLICATION

This application is entering into the national phase of PCT application No. PCT/CN2014/074369, filed on Mar. 31, 2015, which claims priority of Chinese Patent Application (No. 201310618361.8), filed on Nov. 28, 2013, which is incorporated herein by reference in its entirety.

TECHNICAL FIELD

The invention relates to a resistive random access memory (RRAM), and particularly relates to a design for a 2-bit resistive random access memory cell with high uniformity and low power consumption and a method for fabricating the same, which belongs to a field of nonvolatile memory performance optimization in CMOS ultra large scale integrated circuit (ULSI) and the fabrication technology thereof.

BACKGROUND OF THE INVENTION

In recent years, as the device size continue to shrink, especially after progressing to the nano-sized nodes, the shrinking ability (scaling) of NVM devices such as Flash in a current mainstream will reach a limit, random fluctuation is increased significantly, the reliability problems become increasingly severe. in view of this, researchers have proposed in succession some new memories such as the electric charge trap memory (CTM), ferroelectric random access memory (FeRAM), a magnetic random access memory (MRAM), phase change random access memory (PRAM), resistive random access memory and so on. Among them, the resistive random access memory (RRAM) attracts a great upsurge in research and development in recent years due to simple structure, excellent performance and significant shrinkable characteristics thereof, and is officially listed, in ITRS (International Technology Roadmap for Semiconductors), as new memory that will centre on development in future. Nevertheless, further development of resistive random access memory is still facing many challenges, which is embodied significantly in some aspects such as the uniformity concern of the operating voltage and resistance state, the reliability concern such as endurance and retention, large reset current which hinders the achievement of low power consumption, how to achieve higher density integration and so on. The present invention proposes the solutions for solving the above concerns.

As described above, resistive random access memory has a simple structure, and is mainly composed of three layer structure (MIM) including a top electrode, a resistive material film and a bottom electrode; and the resistive material usually select a metal oxide with simple structure. As for the resistive mechanism, it is generally considered to be caused by moving of oxygen vacancies (or oxygen ions). Specifically, "set" operation is that oxygen vacancies are generated in the resistive material film under action of the electric field and are moved and accumulated under action of the electric field, finally low-resistance conductive filament (CF) is formed locally, the device is converted to low-resistance state (LRS); and "reset" process is divided into two types of unipolar one and bipolar one depending on whether action of thermal or electric field dominates: unipolar reset is that the oxygen ions around CF is recombined with the oxygen vacancies under the action of thermal, so that the filament is ruptured and the device is converted to high-resistance state (HRS); bipolar reset is that the oxygen ions are moved reversely and recombined with the oxygen vacancies under the action of the electric filed opposite to the set process, so that CF is ruptured (or it is referred to as generating of one gap), and is converted to HRS. In addition, in order to increase storage density, people realize the multi-level storage by adjusting the set or reset process. Specifically, one method is to achieve different LRS resistance values by adjusting the current compliance (CC) to adjust the width of CF (or the oxygen vacancy concentration in CF) in the set process; the other method is to achieve different HRS resistance values by adjusting a stop voltage to adjust the length of the gap in the reset process. Thus, one HRS and three LRS with different resistance values or one LRS and three HRS with different resistance values can constitute a 2-bit storage of a single device; similarly, it can also achieve 3-bit or even higher density storage by suitable adjusting. However, the formation-rupture of CF in general resistive random access memory occurs in a single resistive layer, due to the greater random fluctuation of the width of CF (or the oxygen vacancy concentration in CF) and the gap adjusting, the uniformity concern is serious, that is, the overlapping occurs between different resistance states.

SUMMARY OF THE INVENTION

Based on the concerns as above, the present invention may achieve complete formation-rupture of oxygen vacancy conductive filaments (CF) in each layer by dividing a resistive material film of the same metal oxide into four layers according to the different oxygen concentrations, so as to control accurately the resistance values, so that 2-bit storage with high uniformity is achieved. In addition, by adjusting properly the resistance value of each layer of the four-layer structure, low current operation can be performed, and thus the low power consumption can be achieved. At the same time, according to the principle of the present invention, the storage of 3-bit and more density can be further achieved.

The technical solutions of the present invention are described as follows:

A resistive random access memory may comprise a substrate, an insulating layer, a bottom electrode, a resistive material film, and a top electrode in an order from bottom to top, wherein the resistive material film is a four-layer structure composed of a same metal oxide; and the four layers in the four-layer structure from bottom to top have resistance values which are increased one after another by 10 times, oxygen concentrations which are increased one after another and thicknesses which are decreased one after another.

In the resistive random access memory, from bottom to top in the four-layer structure, the resistance value of a first layer has a range of $10^3\Omega$ to $10^4\Omega$, the resistance value of a second layer has a range of $10^5\Omega$ to $10^6\Omega$, the resistance value of a third layer has a range of $10^7\Omega$ to $10^8\Omega$, and the resistance value of a fourth layer has a range of $10^9\Omega$ to $10^{10}\Omega$.

In the resistive random access memory, the substrate adopts Si substrate and crossbar structure (or the other common MIM structure).

In the resistive random access memory, materials for the bottom electrode and the top electrode are conductive metal or metal nitride.

In the resistive random access memory, the resistive materials select transition metal oxide materials.

In the resistive random access memory, the transition metal oxide includes HfOx, TaOx, ZrOx or WOx.

Meanwhile, the present invention provides a method for fabricating a resistive random access memory, the method comprises the steps of:

(1) preparing a bottom electrode: sputtering metal Ti/M on a substrate by using PVD (or electron beam evaporation), and forming the bottom electrode by performing patterning using lifting-off or etching process, wherein Ti is used for an adhesion layer, and M is used for the bottom electrode;

(2) preparing a resistive material film of four layers on the bottom electrode from bottom to top, wherein the resistive material film is composed of a same metal oxide; and the four layers in the four-layer structure from bottom to top have resistance values which are increased one after another by more than 10 times (including 10 times), oxygen concentrations which are increased one after another and thicknesses which are decreased one after another;

(3) preparing by using PVD sputtering (or electron beam evaporation) and patterning the top electrode on resistive material film, and defining a size of the device.

In the step (2), by a sputtering process, sequentially depositing the four layers of resistive material in the same chamber by adjusting oxygen partial pressure to prepare the resistive material film.

In the step (2), by a thermal oxidation process, sequentially depositing the four layers of resistive material by adjusting thermal oxidation conditions such as oxygen gas ratio in the atmosphere, oxidation time, and oxidation temperature to prepare the resistive material film.

In the step (2), by an ALD process, sequentially depositing the four layers of resistive material by adjusting ratio of input reducing atmosphere to prepare the resistive material film.

The resistive random access memory design proposed by the present invention mainly has the following three advantages:

(1) the fabricating processing is compatible with CMOS processing, and compared with a general RRAM, no new process step is added, the operation being simple and easy to implement.

(2) 2-bit storage with high uniformity can be achieved by using the resistive material film of four-layer structure with different oxygen concentrations: as shown in FIG. 3, it is assumed that the four layers of resistive film MOx-1, MOx-2, MOx-3, and MOx-4 from bottom to top have the respective resistance values R1, R2, R3, and R4, wherein R1<<R2<<R3<<R4, then the value of the high resistance state is determined by R4, that is, HRS≈R4; during a set operation, a small voltage is applied, and a confined current value is set to the current value corresponding to the resistance value R3 of MOx-3, so that the conductive filament CF is generated in only the most top layer MOx-4, as shown in FIG. 4, thereby the resistance after the set operation is determined by R3, that is, LRS3≈R3; similarly when continuing to a set operation, the constant current value is set to the current value corresponding to the resistance value R2 of MOx-2, so that the conductive filament CF is further generated in the third layer MOx-3, as shown in FIG. 5, thereby the resistance after the set operation is determined by R2, that is, LRS2≈R2; furthermore, continuing to a set operation, the constant current value is set as the current value corresponding to the R1 resistance value of MOx-1, so that the conductive filament CF is further generated in the second layer MOx-2, as shown in FIG. 6, thereby the resistance value after the set operation is determined by R1, that is, LRS1≈R1, and when performing reset, the device state is sequentially changed from LRS1 to LRS2, and is further reset to LRS3, HRS by adjusting properly reset voltage.

As described above, by making the complete formation-rupture occur in the conductive filament in a corresponding one of layers each time, the corresponding four states may be controlled accurately, thereby 2-bit storage with high uniformity may be achieved.

(3) furthermore, because the resistance value of each layer may be adjusted by the processing, when the resistance value of each layer is set to be larger, the current of the corresponding resistance state of the device is smaller, thereby the low power consumption storage may be achieved.

DETAILED DESCRIPTION OF THE EMBODIMENTS

Hereinafter, the present invention will be further described with reference to the drawings, but the scope of the present invention is not limited thereto.

Figure 1:
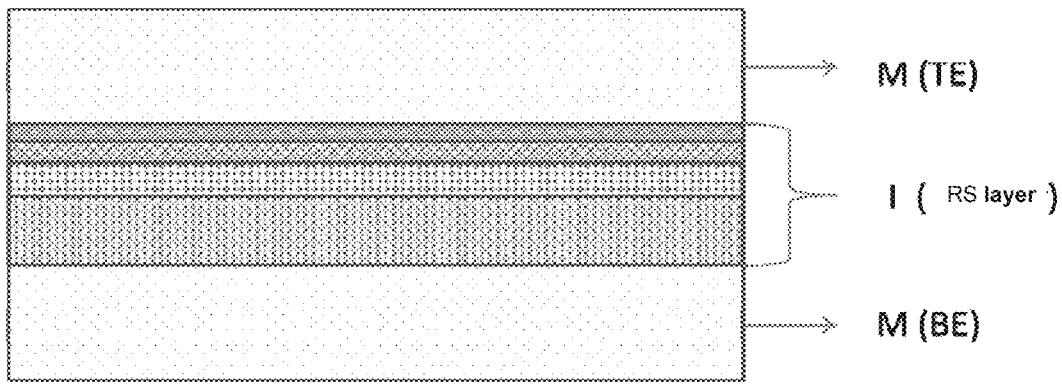
FIG. 1 is a cross-section schematic view illustrating a structure of RRAM according to the present invention.

The present invention provides a resistive random access memory, the structure of which is shown in FIG. 1, and has the main differences, from the mainstream resistive random access memory structure (MIM), that the resistive material film is composed of four-layer metal oxide (MOx) with the oxygen concentration gradient, the four layers from bottom to top are abbreviated respectively as MOx-1, MOx-2, MOx-3, and MOx-4, where from MOx-1 to MOx-4, the oxygen concentrations are increased one after another, and the thicknesses are decreased one after another, and the gradient among the resistance values of the respective layers are achieved by control of a corresponding experiment (in the experiment, whenever the oxygen concentration or the thickness of the film is adjusted, the resistance value is measured, and the corresponding oxygen concentration range or the thickness of the film is selected according to the set resistance value range), for example, the resistance value of MOx-1 has a range approximately of $10^3\Omega$ to $10^4\Omega$, the resistance value of MOx-2 has a range approximately of $10^5\Omega$ to $10^6\Omega$, the resistance value of MOx-3 has a range approximately of $10^7\Omega$ to $10^8\Omega$, and the resistance value of MOx-4 has a range approximately of $10^9\Omega$ to $10^{10}\Omega$.

Figure 2:
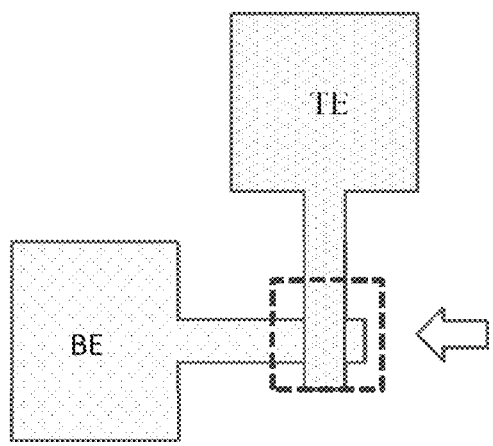
FIG. 2 is a top view illustrating a crossbar structure of the RRAM according to the present invention.

The detailed description of the illustrated structure is made as follows:

(1) a substrate is a substrate using Si and has a general crossbar structure, as shown in FIG. 2;

(2) material for a bottom electrode and a top electrode are a conductive metal or a metal nitride, such as Pt, Al, Ti or TiN, TaN, WNx and so on.

(3) a key point is a middle resistive layer of four-layer structure. The resistive material may preferably select the current mostly popular transition metal oxide materials (such as HfOx, TaOx, ZrOx, WOx, etc.), where each oxide may select appropriate gradient of oxygen content according to the resistance value corresponding to the oxygen content, and thus the four layers are deposited sequentially in an order that the oxygen contents are increased one after another and the thicknesses are decreased one after another.

A fabrication process flow for the resistive random access memory of the present invention is provided as follows:

(1) preparing a bottom electrode, comprising sputtering metal Ti/M on the substrate by using PVD (or electron beam evaporation) and forming the bottom electrode by performing patterning using lifting-off or etching process, where Ti is used for an adhesion layer and M is used for the bottom electrode;

(2) preparing a resistive film.

The first method: by the sputtering process, sequentially depositing the four layers of resistive materials in a same chamber by adjusting the oxygen partial pressure in the sputtering chamber where, according to the common experiment parameters of the materials used for RRAM device, firstly experimenting the film once, then measuring the resistance, and increasing the oxygen concentration or increasing slightly the thickness if the resistance value of the experimented film is below the set resistance value range; by analogy, the set for the experiment condition of the four layers is completed to prepare the resistive material film.

The second method: by a thermal oxidation process, sequentially depositing the four layers of resistive materials by adjusting oxygen gas ratio in the oxidation atmosphere, oxidation time, and oxidation temperature (which is similar to the first method, the experiment conditions corresponding to different resistance values are adjusted and tested in advance) to prepare the resistive material film.

The third method: by ALD process, sequentially depositing the four layers of resistive materials by adjusting the ratio of the input reducing atmosphere in the ALD processing chamber (similar to the first method, the experiment conditions corresponding to different resistance values are adjusted and tested in advance) to prepare the resistive material film.

(3) preparing a top electrode, wherein the top electrode is prepared by PVD sputtering (or the electron beam evaporation) and patterned, and the size of the device is defined.

Embodiment 1

The present invention is described below in further detail with TaOx resistive random access memory as an example with reference to the accompanying drawings and specific embodiments.

Figure 7:
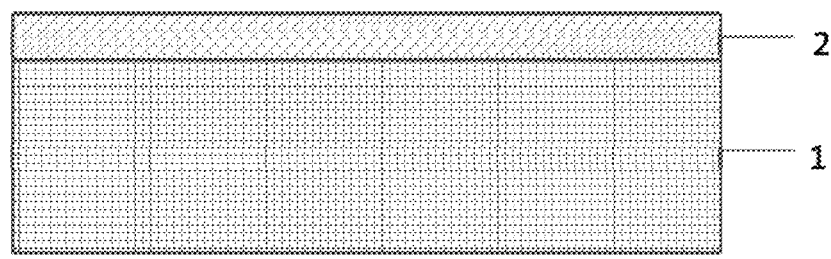
FIG. 7 to FIG. 13 are schematic views assistant to illustrate RRAM structure in the fabrication process flow of the present invention.
Figure 8:
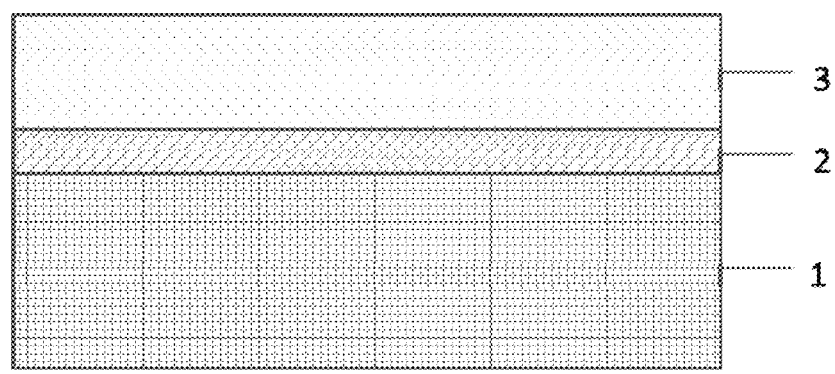
Figure 9:
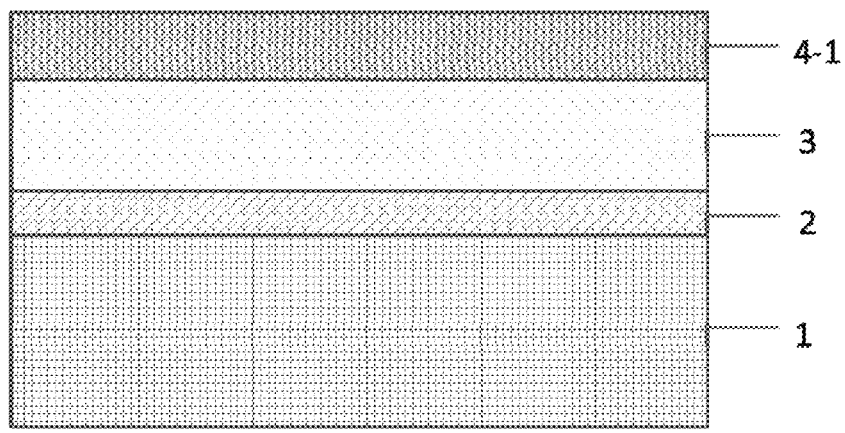
Figure 10:
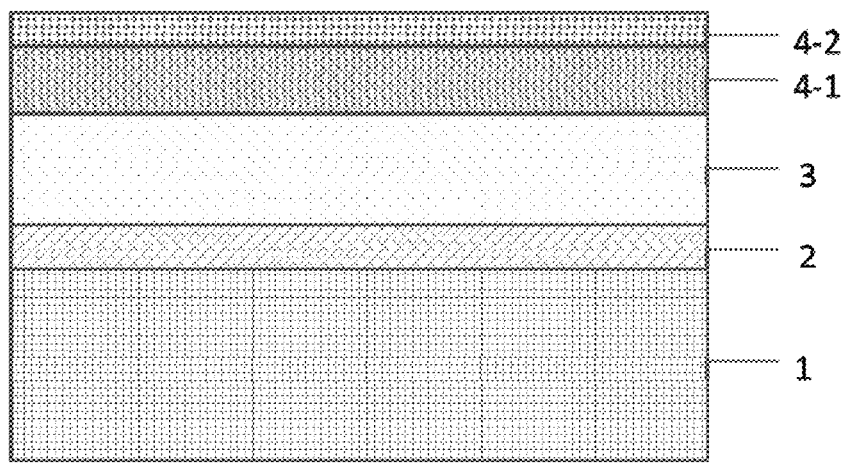

The fabrication process for 2-bit resistive random access memory cell with high uniformity and low power consumption in accordance with the present invention is provided as follows:

1) preparing an insulating layer, comprising growing SiO2 on a Si substrate 1 as the insulating layer 2, as shown in FIG. 7;

2) preparing a bottom electrode, comprising sputtering metal Ti/M, wherein Ti is used for an adhesion layer, M is used for the bottom electrode 3, as shown in FIG. 8, M is a conductive metal or a metal nitride, such as Pt, Ag, Ir, Ru, Au, Pd, W, Ni, Cu, Ti, TiN, TaN, WNx or the like;

3) preparing a first layer of resistive material film, wherein the first layer 4-1 of TaOx resistive material film is prepared, with a thickness of 30 nm, oxygen partial pressure of 3% and a film resistance of approximately $10^3 \Omega$, by PVD magnetron sputtering process (the oxygen partial pressure and the thickness given here are values just for reference, the specific corresponding thickness and resistance value corresponding to oxygen partial pressure need to be determined by the experiment in advance, similar to the following three steps; the experiment includes adjusting the oxygen concentration and the film thickness, then measuring the resistance, and in turn adjusting the oxygen concentration and the thickness according to whether the resistance is above or below the set resistance range, for example, if the resistance value of the film by the experiment is below the set resistance value range, increasing the oxygen concentration or the thickness of the film), as shown in FIG. 9;

4) preparing a second layer of the resistive material film, wherein next to the previous step, by adjusting and controlling the oxygen partial pressure in the sputtering chamber, it progresses to preparing the second layer 4-2 of TaOx resistive material film with the thickness of 20 nm, the oxygen partial pressure of 7% (ditto, the values of the oxygen partial pressure and the thickness are provided here for reference) and the film resistance of approximately $10^5 \Omega$, as shown in FIG. 10.

Figure 11:
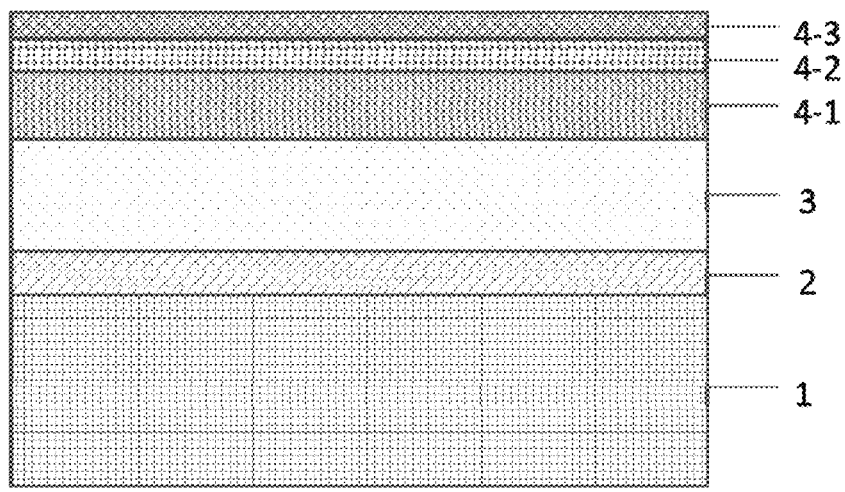

5) preparing a third layer of resistive material film, wherein next to the previous step, by adjusting the oxygen partial pressure in the sputtering chamber, it progresses to preparing the third layer 4-3 of TaOx resistive material film with the thickness of 10 nm, the oxygen partial pressure of 15% (ditto, the values of the oxygen partial pressure and the thickness are provided here for reference) and the film resistance of approximately $10^7 \Omega$, as shown in FIG. 11.

Figure 12:
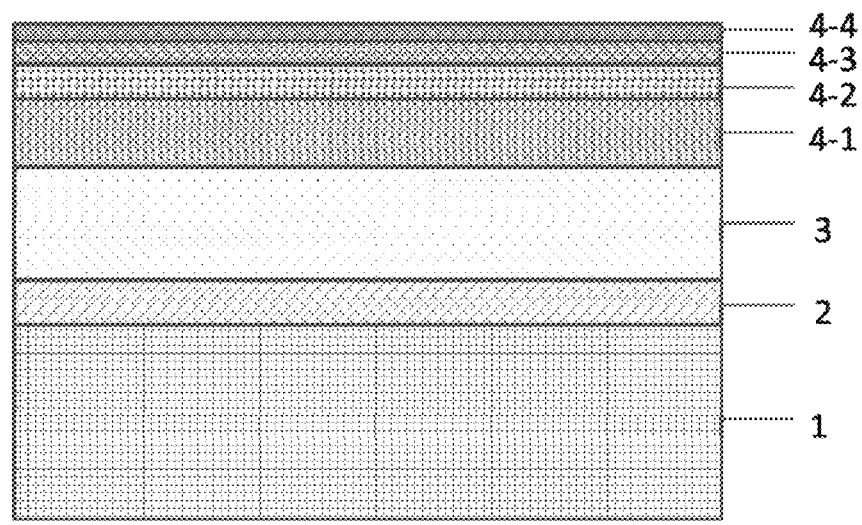
Figure 13:
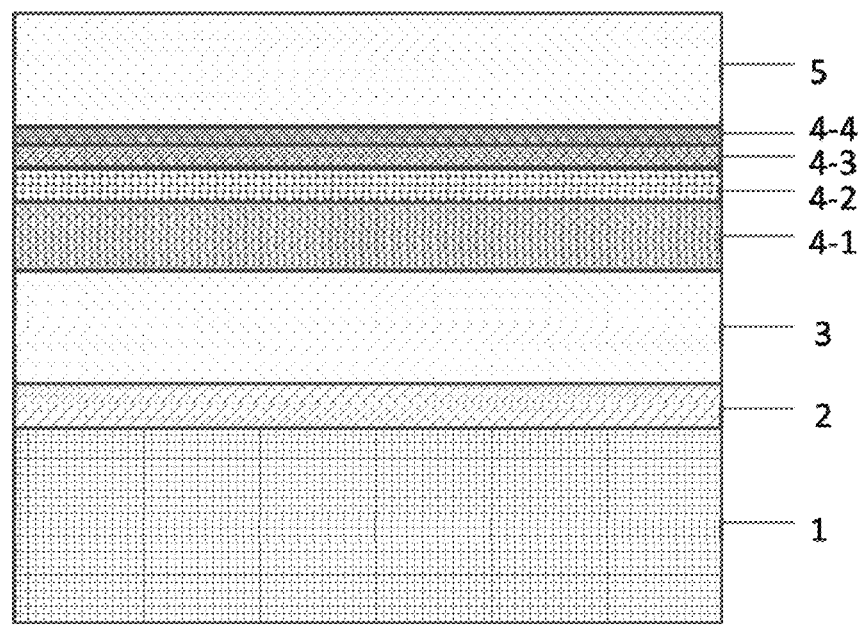

6) preparing a fourth layer of the resistive material film, wherein next to the previous step, by adjusting the oxygen partial pressure in the sputtering chamber, it progresses to preparing the fourth layer 4-4 of TaOx resistive material film with the thickness of 5 nm, the oxygen partial pressure of 50% (ditto, the values of the oxygen partial pressure and the thickness are provided here for reference) and the film resistance of approximately $10^9 \Omega$, as shown in FIG. 12.

Figure 3:
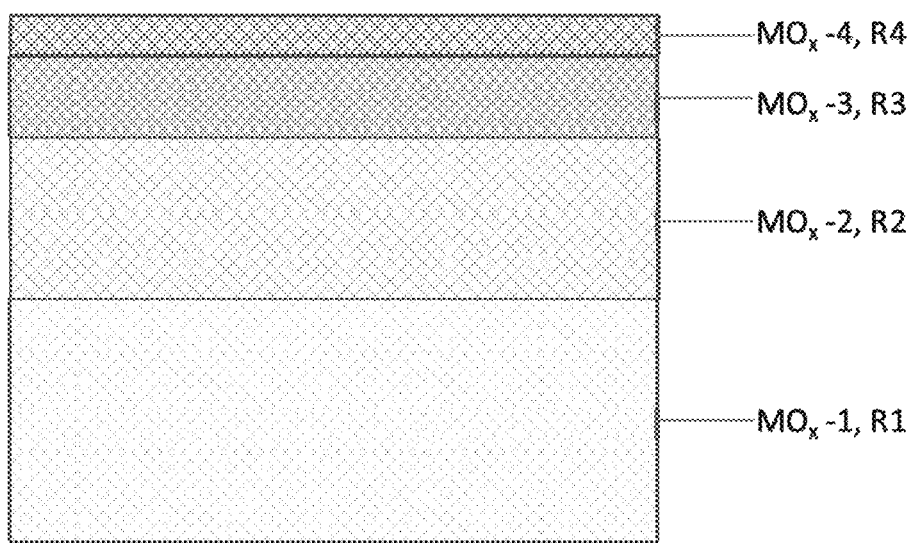
FIG. 3 is a schematic view illustrating the four-layer resistive film.
Figure 4:
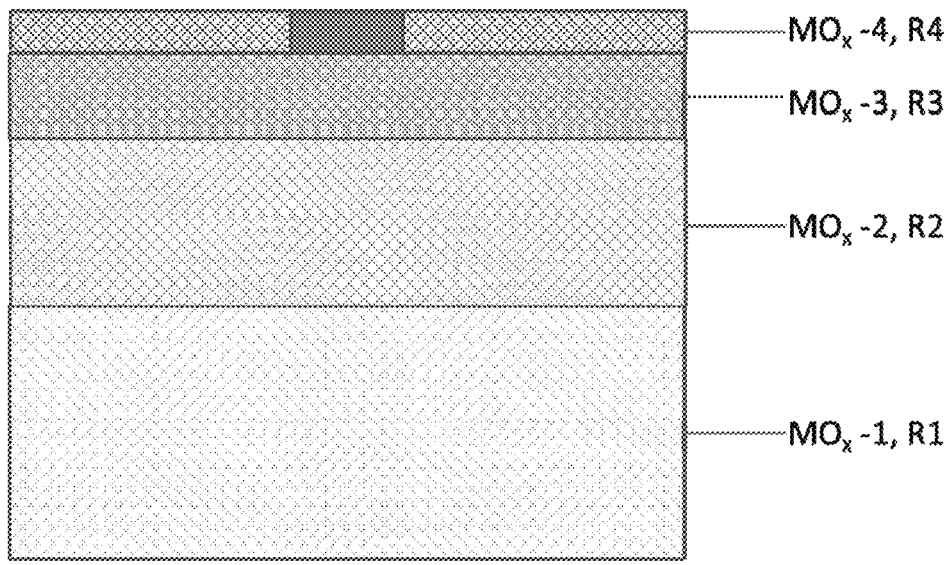
FIG. 4 to FIG. 6 are schematic views illustrating sequentially achieving a 2-bit resistive process in an electrical operation.
Figure 5:
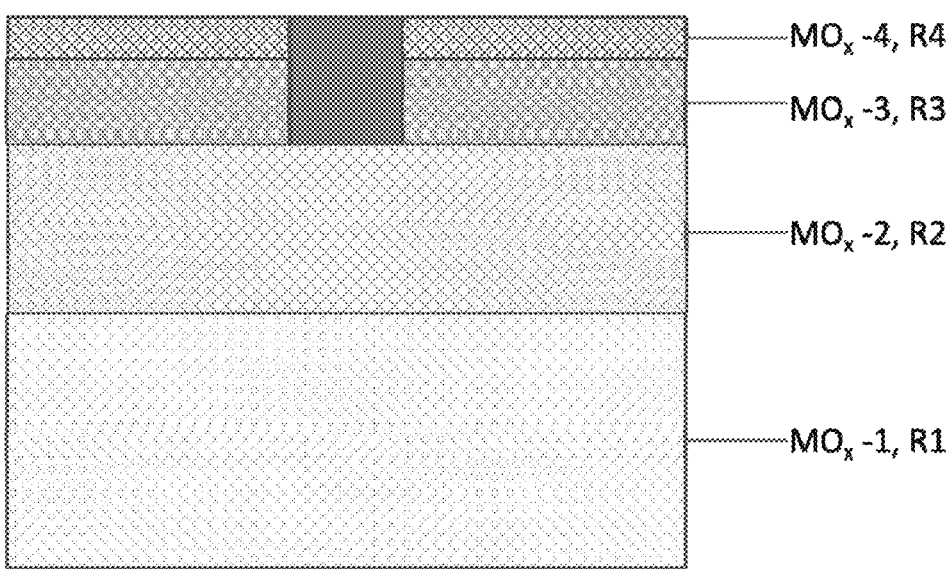
Figure 6:
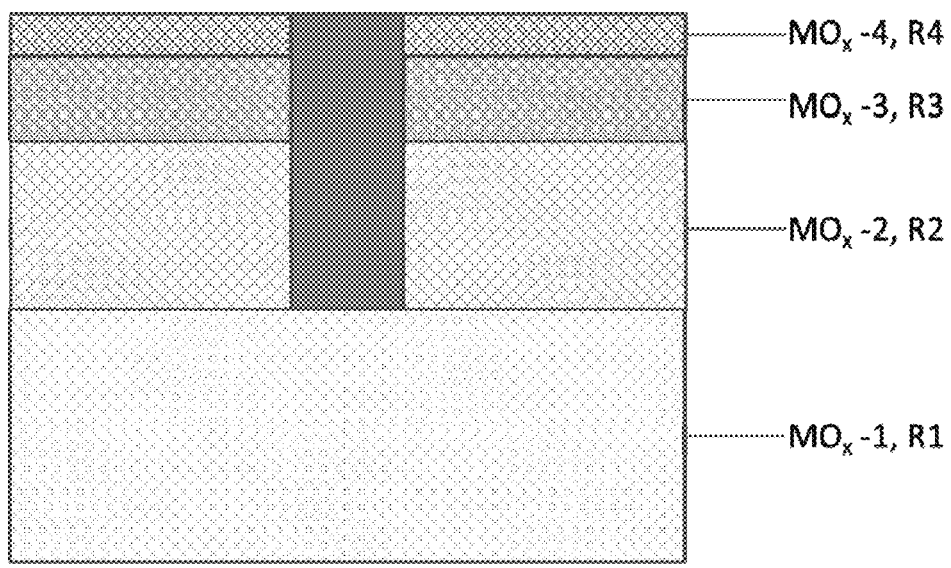

7) preparing a top electrode, wherein the top electrode 5 is prepared by using PVD sputtering and patterned, and a size range of the device (2 µm×2 µm~100 µm×100 µm) is defined, as shown in FIG. 3, then the process flow is completed.

The present invention can achieve the resistive material film of four-layer structure by adjusting and controlling the oxygen component in the sputtering process, without additional process steps being added, so that 2-bit resistive random access memory with high uniformity and low power consumption is prepared. The processing is simple and the performance is improved significantly.

What is claimed is:

1. A resistive random access memory, comprising a substrate, an insulating layer, a bottom electrode, a resistive material film, and a top electrode in an order from bottom to top, wherein the resistive material film is a four-layer structure composed of a same metal oxide; and the four layers in the four-layer structure from bottom to top have resistance values which are increased one after another by at least 10 times, oxygen concentrations which are increased one after another and thicknesses which are decreased one after another.

2. The resistive random access memory according to claim 1, wherein from bottom to top in the four-layer structure, the resistance value of a first layer has a range of $10^3\Omega$ to $10^4\Omega$, the resistance value of a second layer has a range of $10^5\Omega$ to $10^6\Omega$, the resistance value of a third layer has a range of $10^7\Omega$ to $10^8\Omega$, and the resistance value of a fourth layer has a range of $10^9\Omega$ to $10^{10}\Omega$.

3. The resistive random access memory according to claim 1, wherein the substrate adopts Si substrate and crossbar structure.

4. The resistive random access memory according to claim 1, wherein materials for the bottom electrode and the top electrode are conductive metal or metal nitride.

5. The resistive random access memory according to claim 1, wherein the resistive materials select from transition metal oxide materials.

6. The resistive random access memory according to claim 5, wherein the transition metal oxide includes HfOx, TaOx, ZrOx or WOx.

7. A method for fabricating the resistive random access memory according to claim 1, comprising the steps of:
   (1) preparing a bottom electrode: sputtering metal Ti/M on a substrate by using PVD or electron beam evaporation, and forming the bottom electrode by performing patterning using lifting-off or etching process, wherein Ti is used for an adhesion layer, and M is used for the bottom electrode;
   (2) preparing a resistive material film of four layers on the bottom electrode from bottom to top, wherein the resistive material film is composed of a same metal oxide; and the four layers in the four-layer structure from bottom to top have resistance values which are increased one after another by at least 10 times, oxygen concentrations which are increased one after another and thicknesses which are decreased one after another;
   (3) preparing by using PVD sputtering or electron beam evaporation and patterning a top electrode on the resistive material film, and defining a size of the device.

8. The method for fabricating the resistive random access memory according to claim 7, wherein in the step (2), by a sputtering process, sequentially depositing the four layers of resistive materials in the same chamber by adjusting and controlling oxygen partial pressure in the sputtering chamber to prepare the resistive material film.

9. The method for fabricating the resistive random access memory according to claim 7, wherein in the step (2), by a thermal oxidation process, sequentially depositing the four layers of resistive material by adjusting thermal oxidation conditions such as oxygen gas ratio in the oxidation atmosphere, oxidation time, and oxidation temperature to preparing the resistive material film.

10. The method for fabricating the resistive random access memory according to claim 7, wherein in the step (2), by an ALD process, sequentially depositing the four layers of resistive material by adjusting the ratio of input reducing atmosphere in the ALD processing chamber to prepare the resistive material film.

* * * * *